United States Patent [19]
Bezzant et al.

[11] Patent Number: 5,933,035
[45] Date of Patent: *Aug. 3, 1999

[54] DIGITAL CLOCK FREQUENCY MULTIPLICATION CIRCUIT AND METHOD

[75] Inventors: Daniel G. Bezzant, Pleasanton; Joseph Chacko, San Jose; Ramprasad Rangarajan; Nagina Naresh Shetty, both of Fremont, all of Calif.

[73] Assignee: Cirrus Logic, Inc., Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/774,416

[22] Filed: Dec. 31, 1996

[51] Int. Cl.⁶ .................................................. H03B 19/00
[52] U.S. Cl. ............................ 327/116; 327/119; 327/120
[58] Field of Search .................................. 327/116, 119, 327/120, 121, 122; 377/47, 48

[56] References Cited

U.S. PATENT DOCUMENTS

| | | |
|---|---|---|
| 4,654,851 | 3/1987 | Busby ..................................... 371/27.4 |
| 5,216,301 | 6/1993 | Gleeson, III et al. ................... 327/119 |
| 5,321,734 | 6/1994 | Ogata ......................................... 377/47 |
| 5,389,830 | 2/1995 | Buckingham et al. ................. 327/291 |
| 5,514,990 | 5/1996 | Mukaine et al. ......................... 327/116 |
| 5,530,387 | 6/1996 | Kim ........................................ 327/119 |
| 5,548,235 | 8/1996 | Marbot ................................... 327/158 |

Primary Examiner—Toan Tran
Assistant Examiner—An T. Luu
Attorney, Agent, or Firm—Robert P. Sabath; Frank D. Nguyen

[57] ABSTRACT

A clock frequency multiplier with a rise detector flip-flop connected to a series of buffers having interspersed parallel output taps connected to a binary to Gray converter for providing real time rise status indications. The parallel tap outputs are connected to first, second and third multiplexers, to produce first and second fall outputs and a second rise output. The multiplexers are controlled by first, second and third corresponding tap circuits having hexadecimal inputs from a Gray to hexadecimal converter connected to the output of the binary to Gray converter through a flip-flop clocked by a second rise of the input clock signal.

14 Claims, 5 Drawing Sheets

5,933,035

DIGITAL CLOCK FREQUENCY MULTIPLICATION CIRCUIT AND METHOD

TECHNICAL FIELD

The technical field of the present invention relates to digital clock frequency multiplication and more particularly to semiconductor chips implementing digital clock frequency methods and circuits.

BACKGROUND OF THE INVENTION

Currently, many frequency multiplication circuits and systems rely at least in part on analog components and subsystems. Frequency multipliers are described in P. Horowitz & W. Hill, *Digital Electronics* (Cambridge University Press 1994) at pp. 886–887, which refers to them as non-linear circuits used when high stability signals are required at high frequencies above the range of good oscillators. Analog frequency multipliers unfortunately cannot be implemented as standard cell or gate array designs, because such designs can only implement digital electronic systems. Using analog features limits circuit design portability and adds to complexity and cost.

It is moreover desirable to engage in frequency multiplication without the involvement of higher frequency sources. It is further desirable to implement frequency multiplier systems able to accommodate variation in component characteristics and a modicum of defectiveness in system components.

It is additionally desirable to accomplish accurate frequency doubling and frequency multiplication independent of input clock duty cycle. In selected personal computer (PC) applications subject to power consumption reduction schemes, input clock duty cycles are variable due to irregular starting and stopping of clock operations. Many current frequency multiplication schemes are difficult to implement with irregular duty cycles of the input clock.

Complex fast-on, fast-off circuitry has been developed to accommodate analog frequency doubler and frequency synthesizer circuit requirements. Such complex circuitry is, however, expensive and problematic to operate and control.

SUMMARY OF THE INVENTION

A clock frequency multiplier system and method according to the present invention employs a first rising edge detector flip-flop connected to a series of delay buffers comprising a tapped delay line, each buffer having an output tap. The respective output taps are connected in parallel to each other to a binary to Gray converter and to a plurality of output multiplexers. The parallel tap outputs connected to first, second and third multiplexers produce first and second falling edge outputs and a second rising edge output. The multiplexers are further tap-controlled by first, second and third corresponding tap set circuits having respective hexadecimal inputs from a Gray to hexadecimal converter. The Gray to hexadecimal converter is connected to the output of the binary to Gray converter fed by the output taps, through a flip-flop clocked by the second rise of the input clock signal.

DETAILED DESCRIPTION OF THE INVENTION

Figure 1A:
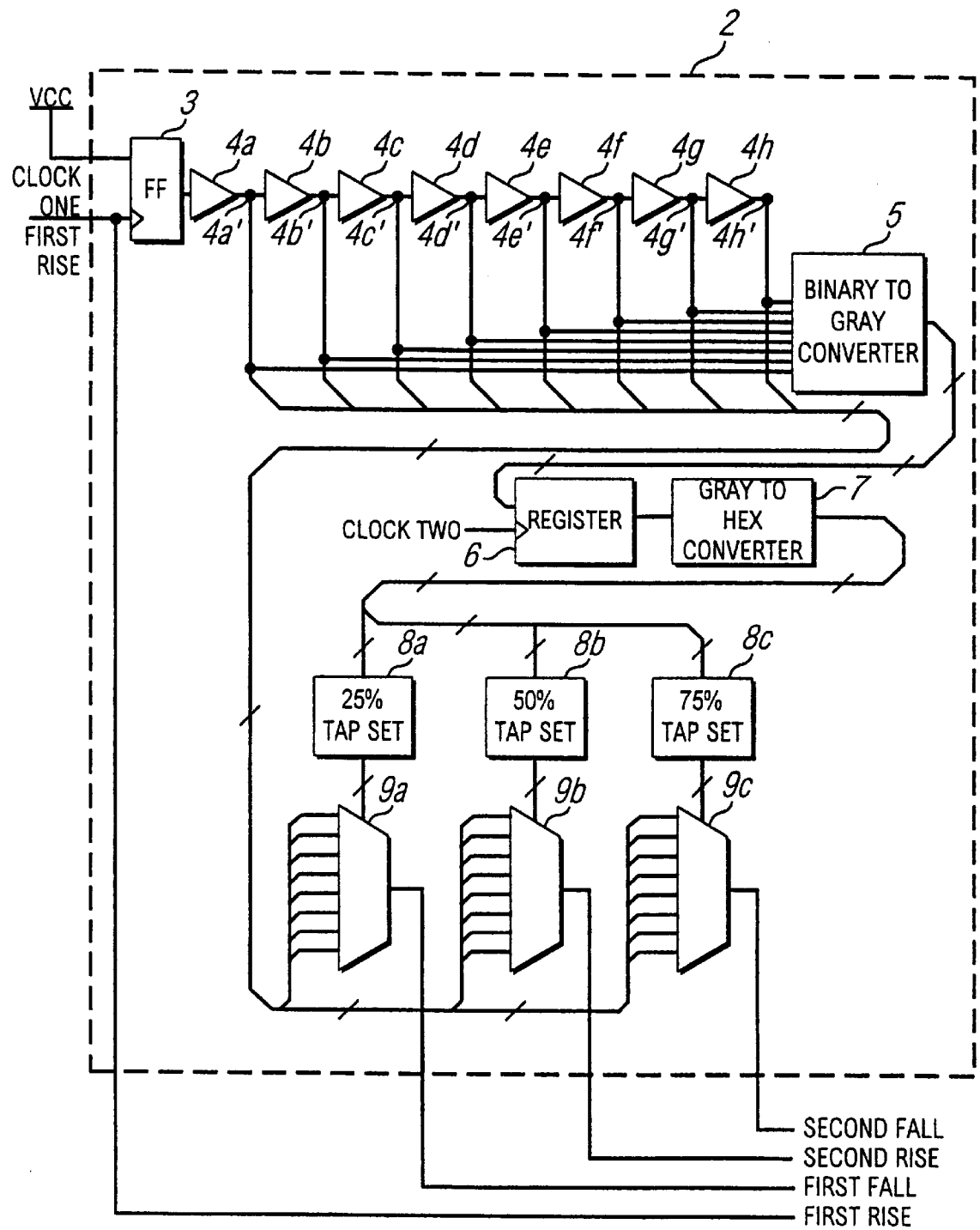
FIG. 1A is a circuit diagram of a digital clock frequency multiplier having a serial bank of delay buffers to generate a code representation of a selected input clock pulse passing through the serial delay buffer bank, according to the present invention.

FIG. 1A is a circuit diagram of a digital clock frequency multiplier 2 according to the present invention. In particular, clock frequency multiplier 2 includes an input flip-flop 3 provided with a clock signal of a predetermined frequency range. Flip-flop 3, according to one embodiment, samples a selected rising edge of the input clock signal and allows the rising edge of the clock signal to propagate through the internal circuitry of frequency multiplier 2. According to one embodiment, flip-flop 3 is a master-slave or D-flip-flop. As is well known, with reference to this embodiment of a clock doubler, a typical doubled clock signal has four primary features within each period of the original reference clock: a first rising edge, a first falling edge, a second rising edge, and a second falling edge.

According to another embodiment of the present invention, where the original reference clock is doubled, flip flop 3 detects a selected falling edge of the input clock. Clock frequency multiplier 2 further includes a delay line including a series of delay buffers 4a–4h such as any of a number of commonly used components of such kind, and a binary to Gray converter 5 such as any of a number of commonly used components of such kind, to which the delay line is connected. The amount of delay provided by each buffer of the delay line may vary considerably over ranges of process, voltage, and temperature. Layout constraints are set to keep delays of any given buffer relative to another within an acceptable limit. According to the present invention, buffer speeds scale together over the length of the delay buffers. The total delay by the entire series of the delay buffers under worst case and best case conditions is long enough to match the period of the slowest input clock anticipated to be provided for multiplication. Likewise, under worst case and best case conditions, the tapped portion of the delay line is positioned to allow adequately accurate sampling of the reference clock at slowest and fastest reference clock frequencies. Delay provided by any one tap of the delay line is also calculated to give the desired degree of accuracy of the multiplication function over range of process voltages and temperatures.

In the present invention, binary to Gray converter 5 increments an incremental amount to show how far a selected clock pulse edge will have traveled in the delay buffers at any given time. General background on Gray code technology is provided at pp. 477 et seq., in Horowitz and Hill, supra. As is well known, Gray code changes only a single bit to reflect a change from one state to a next state. Therefore, the use of Gray code lessens the likelihood of errors, since the probability of an error may be characterized as a function of the number of bit changes attempted. For instance, the probability of an error recurring when a bit remains unchanged if no change in state is desired is less than the probability of error occurring when a bit is changed if no change in state is desired.

Frequency multiplier 2 further includes a flip-flop 6 such as any of a number of commonly used components of such kind and Gray to hex converter 7 such as any of a number of commonly used components of such kind. Flip-flop 6 latches the output of binary to Gray converter 5 into Gray to hex converter 7, at a second rising edge of the input clock signal captured by flip-flop 3 in the form of a first rising edge. Frequency multiplier 2 further includes a plurality of tap set circuits 8a–8c including, according to one embodiment, a 25% tap set circuit (8a), a 50% tap set circuit (8b), and a 75% tap set circuit (8c).

According to another embodiment of the present invention, to set a desired multiplication level, other proportionate tap settings can be employed. For example, the respective tap set values for respective tap set values for respective tap set circuits a–c could be 20%, 40%, and 60%; or 30%, 60%, and 90%; or any other proportionate or substantially proportionate set of values.

Finally, frequency multiplier 2 includes a plurality of multiplexers including, according to one embodiment, first, second, and third multiplexers, respectively multiplexers 9a, 9b, and 9c, which in turn are correspondingly connected to tap sets 8a, 8b, and 8c. Multiplexer 9a produces an output controlled by 25% tap set circuit 8a. Multiplexer 9b produces an output controlled by 50% tap set circuit 8b. Multiplexer 9c produces an output controlled by 75% tap set circuit 8c. Multiplexers 9a–9c consequently provide respective multiplied frequency waveform features including a first falling edge, a second rising edge, and a second falling edge. The first rising edges of the original and the multiplied waveforms are coincident.

The 25%, 50%, and 75% tap settings according to one embodiment result in a doubled frequency output waveform. By selecting other percentage tap settings, for example, 40%, 50%, and 60%, a duty cycle may be specified. To generate a doubled frequency output waveform, the respective outputs of multiplexers 9a, 9b, and 9c are provided as output connections. As noted above, to modify the multiplication factor of frequency multiplier 2, the percentages of the tap settings of tap set circuits a–c are proportionately modified. Each tap setting selects a particular tap 4a'–4h' corresponding to its associated tap setting. For example, a hex output of "4" from Gray to hex converter 7 will produce respective tap settings of 1, 2, and 3 for respective taps 8a, 8b, and 8c. Accordingly, by way of an example, multiplexer 9a will produce the clock waveform present at the first tap, tap 4c'; multiplexer 9b will produce the clock waveform present at the second tap, tap 4b'; and multiplexer 9c will produce an output waveform present at the third tap, tap 4a'.

Delay buffers 4a–4h include respective output taps 4a'–4h'. The delays provided by each delay buffer may vary considerably in particular gate array or standard cell designs. According to one embodiment, the delay through a delay buffer is on the order of approximately one nano second. The variation in delays can be 300–400 percent. The delay through a single delay buffer is such that two clock edges of like character can be expressed within the series of delay buffers 4a–4h. Clock frequency multiplier 2 according to the present invention further includes a first rise detector flip-flop 3, which according to one embodiment of the present invention, detects the first rise (i.e., rising edges of received clock signals or pulses).

Delay buffers 4a–4h are associated with output taps connected in multiple parallel lines to binary to Gray converter 5.

A delay line according to the present invention includes sufficient buffers and has sufficient length to be able to allow a selected clock waveform feature to propagate within the delay line until a corresponding feature of a next clock waveform arrives at the beginning of the delay line.

Figure 1B:
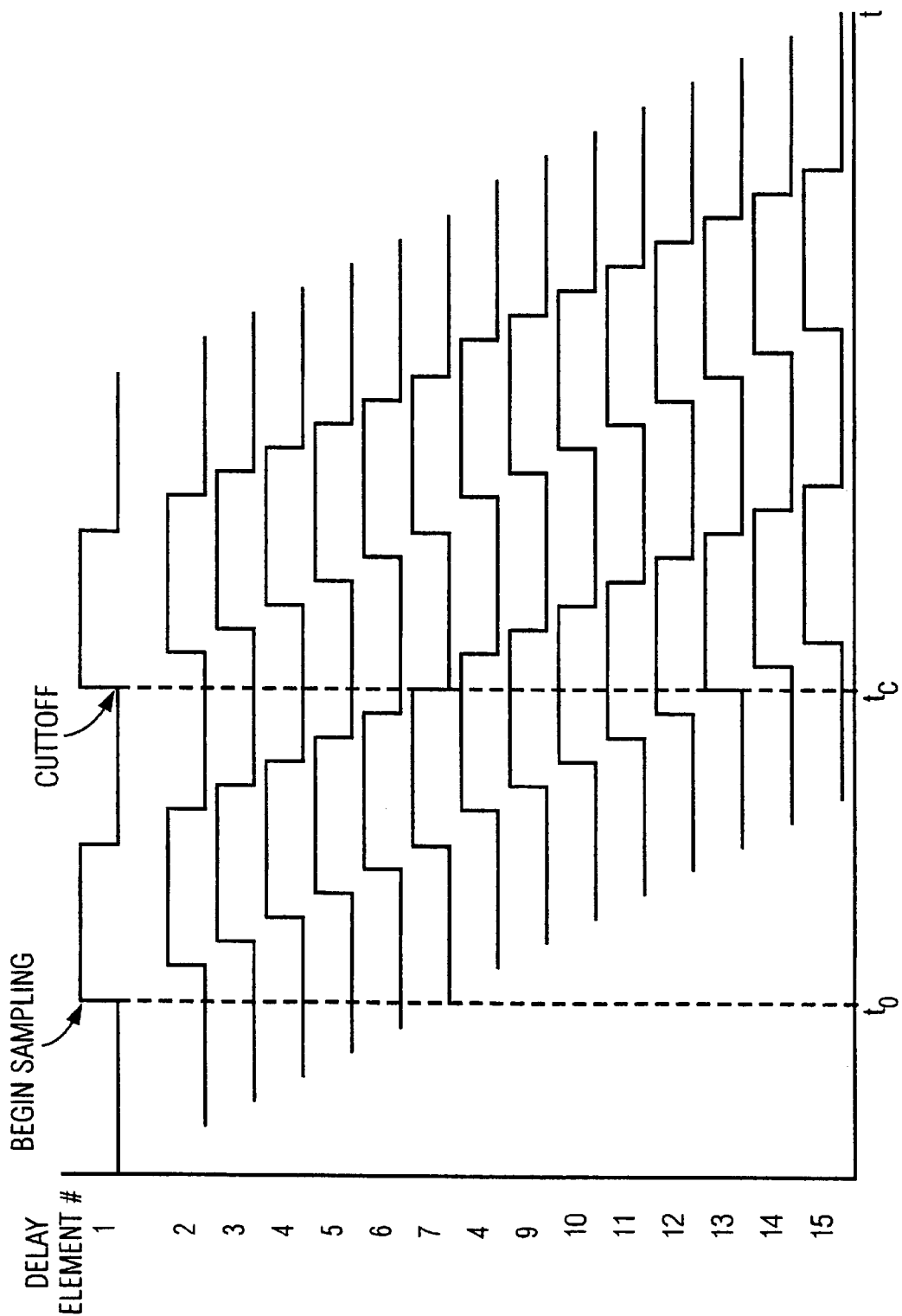
FIG. 1B is a timing diagram of the progress of a selected clock pulse being sampled over the serial delay buffer bank, according to the present invention.

FIG. 1B is a timing diagram of the progress of a selected clock pulse waveform being sampled according to the present invention. As shown in FIG. 1B, sampling begins at an input position of a delay line, according to one embodiment of the present invention, when a first rising edge of an input clock waveform reaches the input position. Sampling is discontinued or cut off when the first rising edge reaches a cutoff position on the delay line associated with a particular frequency or period, and the second rising edge reaches the input of the delay line. Alternatively, sampling could begin at a second rising edge or another input clock waveform feature such as a falling edge.

Figure 1C:
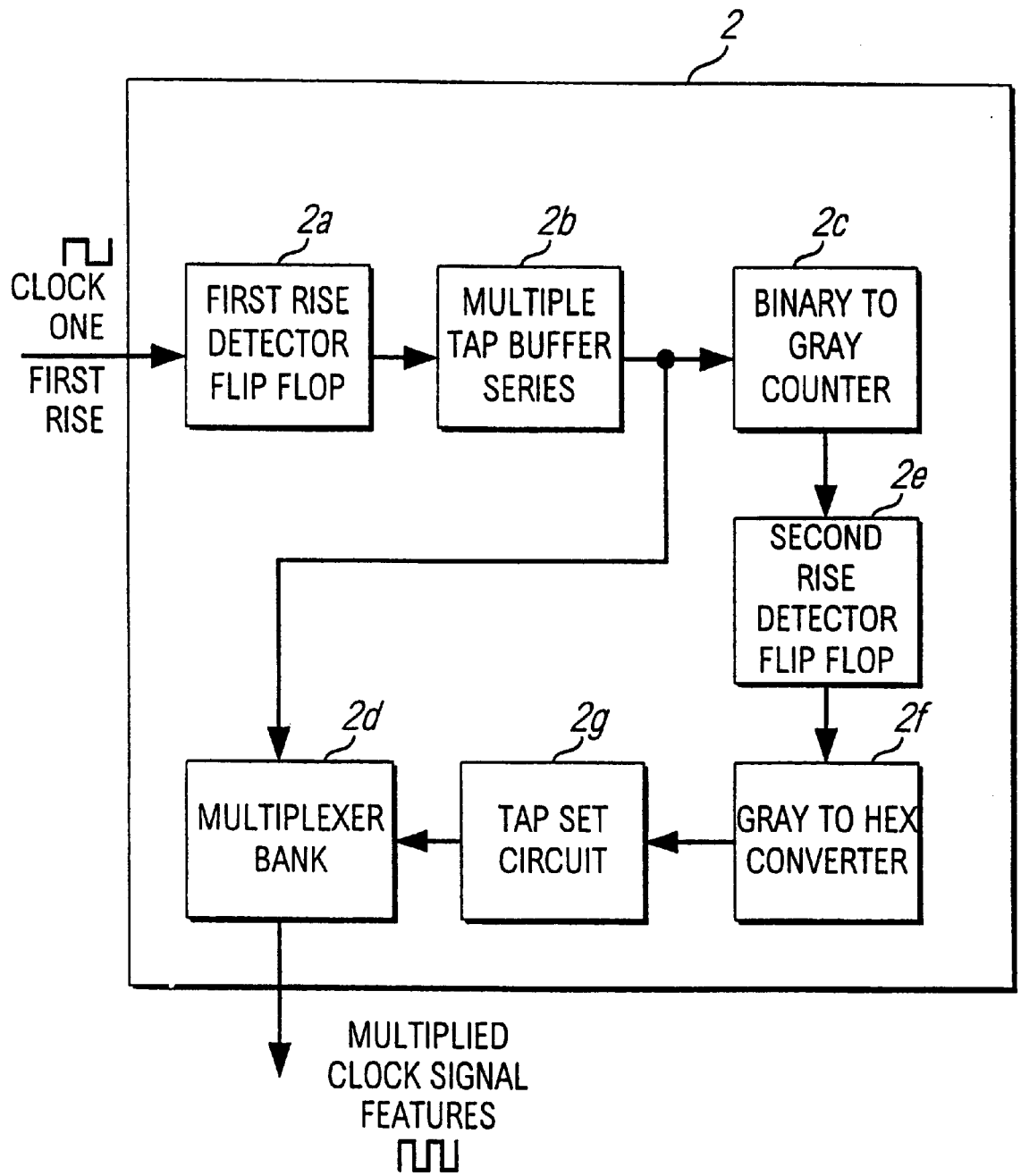
FIG. 1C is a block diagram of a digital clock frequency multiplier, according to the present invention.

FIG. 1C is a block diagram of a digital clock frequency multiplier, according to the present invention. In particular, clock frequency multiplier 2 includes a first rising edge detector flip flop 2a which is provided with a clock signal (CLOCK ONE) of a predetermined input clock frequency. First rising edge flip flop 2a, according to one embodiment, samples the rising edge of the input clock signal and allows the rising edge to propagate through a multiple tap buffer series 2b of delay elements. Clock frequency multiplier 2 further includes a binary to Gray counter 2c, a second rising edge detector flip-flop 2e, a Gray to hex converter 2f, a tap set circuit 2g, and a multiplexer bank 2d. First rise detector flip flop 2a produces a waveform which travels through multiple tap buffer series 2b having a series plurality of tapped buffers. The taps of multiple tap buffer series 2b are connected to binary to Gray counter 2c and to multiplexer bank 2d. Binary to Gray counter 2c is in turn connected to second rise detector flip-flop 2e which in turn is connected first to Gray to hex converter 2f. Gray to hex converter is then connected to tap set circuit 2g which controls multiplexer bank 2d in selecting tap outputs from multiple tap buffer series 2b.

Figure 2:
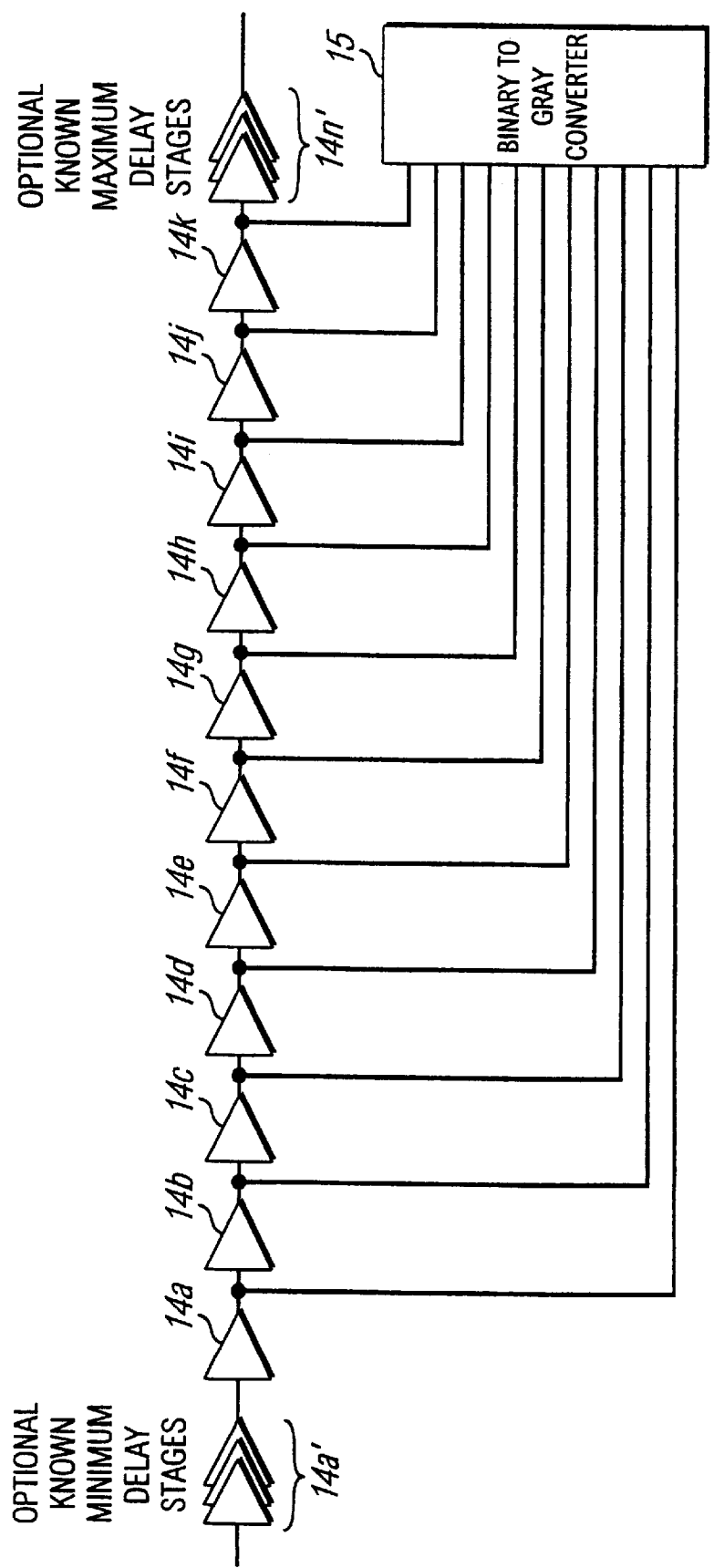
FIG. 2 shows a modified portion of the circuitry of a digital clock frequency multiplier according to the present invention, including input and output delay stages preceding and following a serial bank of delay buffers.

FIG. 2 shows a modified portion of the circuitry of a digital clock frequency multiplier according to the present invention, including a plurality of fixed delay stages 14a' preceding and another set of fixed delay stages 14n' following a serial bank of tapped delay buffers. This permits omission of taps at the beginning and end of the delay line, e.g., those preceding and following the tap values applied to tap set circuits 8a–c. To compensate for the missing tap counts that would be provided by the initial tap connections, a corresponding count constant is provided to Binary to Gray counter 5 as an initial setoff. FIG. 2 particularly shows a delay line including minimum delay stages 14a', midrange delay buffers 14a–14k, and maximum delay stages 14n'. Delay line taps are included after each of delay stages 14a–14k, for connection with binary to Gray converter 15. According to the embodiment shown, delay line taps are only provided in the midrange region of the delay line.

Figure 3:
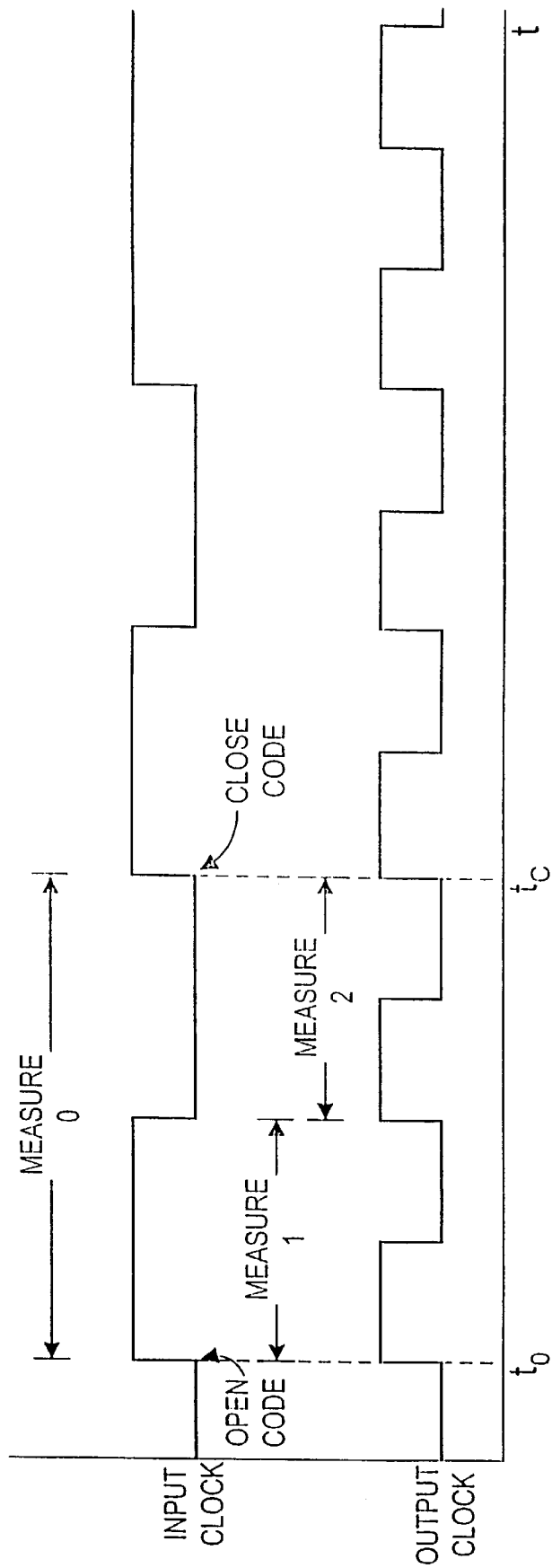
FIG. 3 is a timing diagram illustrating one embodiment of the present invention in which an input clock signal of a first selected frequency is multiplied by an integer factor of two, to produce an output clock signal of twice the input clock frequency.

FIG. 3 is a timing diagram illustrating one embodiment of the present invention in which an input clock signal of a first selected frequency is multiplied by an integer factor of two, to produce an output clock signal of twice the input frequency at flip-flop 2a shown in FIG. 1C. Multiplexer bank 2d produces first and second falling edge output signals and a second rising edge output signal for the output clock signal shown in FIG. 3. Thus, an input waveform of measure 0 is converted into an; output waveform having first and second measures 1 and 2 at double the frequency and half the wavelength of respective input waveform portions.

A selected input clock signal is thus multiplied in reference to another by digitally measuring the progress of a selected signal through all or part of a series of digital buffers 4a–4h shown in FIG. 1A by detecting a beginning and end of a selected first signal waveform. A next signal waveform (i.e., CLOCK TWO) is then distributed over at least a portion of the digital buffers 4a–4h, and information is deduced from the digital buffers 4a–4h to specify a multiplied frequency signal in terms of a desired multiplication factor and duty cycle rate, from the length of the first signal waveform and the distribution of the next signal over the digital buffers. The selected signal which is multiplied may cease and reactivate. During signal cessation and reactivation, the signal is measured as it passes through a series of digital buffers. Then, information is deduced to establish a multiplied frequency signal based upon the measurement of the selected signal in digital buffers 4a–4h. The selected frequency signal can be expressed in a selected hardware description language before being measured in delay buffers 4a–4h to specify the multiplied frequency signal.

According to the present invention, the multiplied and/or duty cycle modified signal is created from an input signal by establishing connections on pins or pads or otherwise on a conventional gate array circuit to enable measurement of selected signals through a series of buffers such as shown in FIG. 1A. Gate arrays are common circuit systems which are well known to one skilled in the art. Connections are further established between respective pins or other contacts of selected gate or arrays of a selected gate array circuit in order to deduce information specifying the multiplied frequency signal by multiplication factor and duty cycle rate. According to another embodiment, a multiplied signal can further be developed from another signal by interconnecting a conventional field programmable gate array to enable measurement of selected signals through a series of buffers 4a–4h, and interconnecting pins or other contacts of a field programmable gate array to enable deduction of information for a multiplied frequency signal based upon the selected signals operating within the series of buffers. Further according to the present invention, a well-known standard cell structure is created with a series of buffers to measure a selected signal to be multiplied as it progresses through the series of buffers. Well-known circuit design techniques are used to define the standard cells based upon information in available libraries. The standard cell is further constructed to enable deduction of information to specify a multiplied frequency signal based upon the selected signals operating within the series of buffers. Further according to the present invention, a selected signal having minimum width low and high periods is measured in a series of digital buffers, and information is deduced to create a multiplied frequency signal based upon the measurement of the selected signal in the series of digital buffers 4a–4h. The input signal measured can be intermittent and the output multiplied signal can be of ensured or guaranteed selected periodicity. According to the present invention, frequency multiplication and duty cycle control are accomplished without use of substantial analog circuitry which requires complex attendant support systems. The delay line according to one embodiment of the present invention includes a minimum delay stage preceding a central tapped region. The delay line may further have a maximum delay stage following the tapped delay line region. Delay line taps connected after each intermediate delay stage are coupled to a binary to Gray converter.

According to the present invention, considerable savings are possible by using a digital design approach. Portability of circuit designs is further facilitated by use of digital designs expressed in Boolean form, or in a hardware description language such as Verilog or VHDL, for example, which are converted into a netlist and chip layout.

What is claimed is:

1. A frequency multiplier circuit comprising:
   a first signal detector for detecting a predetermined portion of a clock signal;
   a plurality of delay elements for receiving clock signals, said plurality of delay elements connected in series at respective taps, and including first through nth respective delay elements and corresponding first through nth respective taps, the output of a particular delay element being connected to a corresponding one of said taps, said first clock signal detector being connected to said first delay element and being effective for providing information as to the initiation of an input clock signal;
   a code device connected to said respective first through nth taps, to provide information on the passage of a signal through said plurality of delay elements; and
   a multiplexer circuit having an output connection and a plurality of input connections respectively connected to said first through nth taps, said output connection producing output signals having information defined features and corresponding to input signals received by said first signal detector including first, second, and third multiplexers, each having an output connection and a plurality of input connections respectively connected to said first through nth taps, for producing information of selected signal features of output signals corresponding to input signals received by said first signal detector.

2. A frequency multiplier circuit comprising:
   a first signal detector for detecting a predetermined portion of a clock signal;
   a plurality of delay elements for receiving clock signals, said plurality of delay elements connected in series at respective taps, and including first through nth respective delay elements and corresponding first through nth respective taps, the output of a particular delay element being connected to a corresponding one of said taps, said first clock signal detector being connected to said first delay element and being effective for providing information as to the initiation of an input clock signal;
   a code device connected to said respective first through nth taps, to provide information on the passage of a signal through said plurality of delay elements; and
   a multiplexer circuit having an output connection and a plurality of input connections respectively connected to said first through nth taps, said output connection producing output signals having information defined features and corresponding to input signals received by said first signal detector including first, second, and third multiplexers, each having an output connection and a plurality of input connections respectively connected to said first through nth taps, for producing information of selected signal features of output signals corresponding to input signals received by said first signal detector including first, second, and third tap set circuits connected respectively to said first, second, and third multiplexers, for producing information of successive signal features corresponding to said input signals.

3. A frequency multiplier circuit comprising:

a first signal detector for detecting a predetermined portion of a clock signal;

a plurality of delay elements for receiving clock signals, said plurality of delay elements connected in series at respective taps, and including first through nth respective delay elements and corresponding first through nth respective taps, the output of a particular delay element being connected to a corresponding one of said taps, said first clock signal detector being connected to said first delay element and being effective for providing information as to the initiation of an input clock signal;

a code device connected to said respective first through nth taps, to provide information on the passage of a signal through said plurality of delay elements; and a multiplexer circuit having an output connection and a plurality of input connections respectively connected to said first through nth taps, said output connection producing output signals having information defined features and corresponding to input signals received by said first signal detector including first, second, and third multiplexers, each having an output connection and a plurality of input connections respectively connected to said first through nth taps, for producing information of selected signal features of output signals corresponding to input signals received by said first signal detector including first, second, and third tap set circuits connected respectively to said first, second, and third multiplexers, for producing information of successive signal features corresponding to said input signals, wherein said successive signal features are the second fall, the second rise, and the first fall of output signals to be constructed.

4. A frequency multiplier circuit according to claim 2 wherein said first, second, and third tap set circuits further provide respective 25, 50, and 75 percent tap settings for control of respective ones of said first, second, and third multiplexers.

5. A clock frequency modifier method including:

producing a coded representation of the progress of a selected feature of a clock pulse having four features of a first frequency waveform on a multiple element delay;

applying a selected integer to said coded representation to produce a counterpart to the third feature of said four feature first frequency waveform, at a second selected frequency waveform having corresponding four features;

applying half said selected integer to said coded representation to produce a counterpart to the second feature of said four feature first frequency waveform at said second selected frequency; and applying one and a half of said selected integer to said coded representation to produce a counterpart to the fourth feature of said four feature first frequency waveform at said second selected frequency.

6. A frequency multiplier circuit comprising:

a signal detector for detecting a selected clock pulse edge of a clock signal, said signal detector providing as output a detected signal;

a plurality of delay elements each having an input and an output, the plurality of delay elements connected in series such that there is a first delay element and a last delay element in the series, the output of the signal detector being connected to the input of the first delay element, the plurality of delay elements delaying the detected signal;

a monitor circuit connected to said outputs of the plurality of delay elements, said monitor circuit monitoring progress of the selected clock pulse edge during a clock period in the plurality of delay elements, the monitoring circuit providing as output information on the progress of the selected clock pulse edge in the plurality of delay elements; and a multiplexer circuit receiving as input the outputs of the plurality of delay elements, the multiplexer circuit receiving as a control signal the output of the monitor circuit, in response to information of the progress of the selected clock pulse edge in the plurality of delay elements in a clock period from the monitor circuit, the multiplexer circuit producing output signals indicating clock pulse edges that when combined with the output of the signal detector producing a multiplication of the clock signal.

7. The frequency multiplier circuit of claim 6, wherein the monitor circuit monitoring the progress of the selected clock pulse edge during a clock period in the plurality of delay elements by counting the number of times the selected clock edge is produced by the plurality of delay elements in the clock period.

8. The frequency multiplier circuit of to claim 7, wherein the multiplexer circuit comprising:

a first tap set circuit receiving as input the output of the monitor circuit, the first tap set circuit is being set at a first tap setting to produce a first control signal in response to the output of the monitor circuit;

a first multiplexer receiving as input the outputs of the plurality of delay; elements, the first multiplexer further receiving as input the first control signal, in response to the first control signal, the first multiplexer selectively allowing one of the outputs of the plurality of delay elements to pass through as an output signal;

a second tap set circuit receiving as input the output of the monitor circuit, the second tap set circuit is being set at a second tap setting to produce a second control signal in response to the output of the monitor circuit;

a second multiplexer receiving as input the outputs of the plurality of delay; elements, the second multiplexer further receiving as input the second control signal, in response to the second control signal, the second multiplexer selectively allowing one of the outputs of the plurality of delay elements to pass through as an output signal;

a third tap set circuit receiving as input the output of the monitor circuit, the third tap set circuit is being set at a third tap setting to produce a third control signal in response to the output of the monitor circuit; and a third multiplexer receiving as input the outputs of the plurality of delay; elements, the third multiplexer further receiving as input the third control signal, in response to the third control signal, the third multiplexer selectively allowing one of the outputs of the plurality of delay elements to pass through as an output signal.

9. The frequency multiplier circuit of claim 8, wherein the signal detector detecting a first clock pulse rise edge and providing as output a signal carrying information on the first clock pulse rise edge, the output signal from the first multiplexer carrying information on a first clock pulse fall edge, the output signal from the second multiplexer carrying information on a second clock pulse rise edge, and the output signal from the third multiplexer carrying information on a second clock pulse fall edge, wherein the output signals from the signal detector and the first, second, and third multiplexers combined to produce a multiplication of the clock signal.

10. The frequency multiplier circuit of claim 7, wherein the monitor circuit comprising:

a binary-to-Gray converter receiving as input the outputs of plurality of delay elements, the binary-to-Gray converter counting the number of the selected clock edges produced by the plurality of delay elements in the clock period, the binary-to-gray converter outputting a Gray-code based count signal;

a latch circuit receiving as input the Gray-code based count signal from the binary-to-Gray converter, the latch circuit providing a latched Gray-code based count signal as an output; and a Gray-to-hex converter receiving as input the latched Gray-code based count signal from the latch circuit, the Gray-to-hex converter converting the latched Gray-code based count signal into a hexadecimal based count signal, the Gray-to-hex converter providing the hexadecimal based count signal as the output of the monitor circuit.

11. A method for multiplying a signal in reference to another signal comprising:

detecting a selected clock pulse edge of a clock signal;

supplying a signal related to the selected clock pulse edge;

sequentially delaying the signal using a plurality of delay elements;

monitoring progress of the selected clock pulse edge during a clock period in the plurality of delay elements;

producing signals indicating other clock pulse edges in response to the monitored progress of the selected clock pulse edge in the plurality of delay elements in a clock period; and combining information from the signal related to the selected clock pulse edge with information from the signals indicating other clock pulse edges to form a multiplication of the clock signal.

12. The method of claim 11 wherein the monitoring step involves counting the number of times the selected clock edge is produced by the plurality of delay elements in the clock period.

13. The method of claim 12, wherein the detecting step involves detecting a first clock pulse rise edge.

14. The method of claim 13, wherein the producing step involves producing signals carrying information on a first clock pulse fall edge, information on a second clock pulse rise edge, and information on a second clock pulse fall edge.

* * * * *